United States Patent
Lasson et al.

(10) Patent No.: US 9,030,207 B2
(45) Date of Patent: May 12, 2015

(54) METHOD FOR MONITORING INSULATION FAULTS IN AN ELECTRIC NETWORK AND VEHICLE COMPRISING AN INSULATION FAULT MONITOR

(75) Inventors: Anders Lasson, Göteborg (SE); Jörgen Kjellberg, Torslanda (SE)

(73) Assignee: Volvo Lastvagnar AB, Göteborg (SE)

( * ) Notice: Subject to any disclaimer, the term of this patent is extended or adjusted under 35 U.S.C. 154(b) by 903 days.

(21) Appl. No.: 13/062,239

(22) PCT Filed: Sep. 26, 2008

(86) PCT No.: PCT/SE2008/000530
§ 371 (c)(1),
(2), (4) Date: Mar. 4, 2011

(87) PCT Pub. No.: WO2010/036153
PCT Pub. Date: Apr. 1, 2010

(65) Prior Publication Data
US 2011/0148428 A1    Jun. 23, 2011

(51) Int. Cl.
G01R 31/02 (2006.01)
G01R 31/00 (2006.01)
G01R 31/14 (2006.01)
H01H 31/12 (2006.01)
G01R 27/18 (2006.01)

(52) U.S. Cl.
CPC .............. G01R 31/025 (2013.01); G01R 27/18 (2013.01); G01R 31/006 (2013.01)

(58) Field of Classification Search
CPC .................................................... G01R 31/025
See application file for complete search history.

(56) References Cited

U.S. PATENT DOCUMENTS

| | | | |
|---|---|---|---|
| 5,712,572 A * | 1/1998 | Tamechika et al. | 324/551 |
| 6,952,103 B2 * | 10/2005 | Herb et al. | 324/500 |
| 7,075,311 B1 * | 7/2006 | Oshiro et al. | 324/557 |
| 7,705,605 B2 * | 4/2010 | Hayakawa et al. | 324/522 |
| 8,164,344 B2 * | 4/2012 | Yano et al. | 324/510 |

(Continued)

OTHER PUBLICATIONS

International Search Report for corresponding Intenrational Application PCT/SE2008/000530, May 25, 2009.
International Preliminary Report on Patentability for corresponding International Application PCT/SE2008/000530, Dec. 23, 2010.

(Continued)

*Primary Examiner* — Patrick Assouad
*Assistant Examiner* — Hoang X Nguyen
(74) *Attorney, Agent, or Firm* — WRB-IP LLP

(57) ABSTRACT

A method for monitoring an insulation fault in an electric network with at least one electric power system supplying electric power to one or more electric loads, and at least one insulation resistance monitor is provided, wherein the at least one electric power system includes at least one electrical power source, and wherein the at least one insulation resistance monitor monitors an insulation resistance between terminal leads of the at least one electric power source and at least one reference potential. The steps are performed of disconnecting the at least one electric power source from the one or more loads by opening each terminal lead; measuring the insulation resistance between the electric circuit of at least one electrical power source and the reference potential; measuring the insulation resistance for the total electric network; closing the second terminal lead with the first terminal lead open; and measuring the insulation resistance for the total electric network.

30 Claims, 4 Drawing Sheets

(56) References Cited

U.S. PATENT DOCUMENTS

| | | | |
|---|---|---|---|
| 8,466,691 B2 * | 6/2013 | Hernando et al. | 324/551 |
| 8,497,687 B2 * | 7/2013 | Bauer et al. | 324/510 |
| 2004/0189330 A1 | 9/2004 | Herb et al. | |
| 2008/0158756 A1 | 7/2008 | Lindsey et al. | |
| 2009/0001993 A1 * | 1/2009 | Lindsey et al. | 324/509 |
| 2009/0002903 A1 * | 1/2009 | Uchida | 361/49 |

OTHER PUBLICATIONS

JP2007240300 A Yazaki Corp, Sep. 2, 2007 (abstract).
JP2004006190 A, Fuji Heavy Ind Ltd., Jan. 8, 2007 (abstract).
JP2004170146 A, Yazaki Corp., Jun. 17, 2004 (abstract).
JP2005127821 A, Yazaki Corp., May 19, 2005 (abstract).
JP8294225 A, Nissan Motor, Nov. 5, 1996 (abstract).

* cited by examiner

METHOD FOR MONITORING INSULATION FAULTS IN AN ELECTRIC NETWORK AND VEHICLE COMPRISING AN INSULATION FAULT MONITOR

BACKGROUND AND SUMMARY

The invention relates to a method and a system for monitoring insulation faults in an electric network supplied by at least one electric power source and a vehicle comprising an insulation fault monitor.

In hybrid electric vehicles, the "high-voltage" electric system is isolated from vehicle chassis ("floating ground"). If a person touches, for example, the positive pole of the DC-bus, there will not be a risk for electric shock. However, if there is an insulation fault in the "high-voltage" electric system, i.e. one of the electric poles comes into contact with the vehicle chassis, there is a risk for electric shock if a person gets in contact with the other pole.

It is known in the art to provide an insulation resistance monitor in the battery that monitors the insulation resistance so that the control system can de-energize the electric system to avoid risk for electric shock. For instance JP 2005127821 A and JP 08294225 A disclose an insulation resistance monitor.

U.S. Pat. No. 6,952,103 B2 discloses an insulation resistance monitor and a method for detecting insulation faults on an electrically driven vehicle. In order to sense the resistance between the battery terminals and the ground potential, a measuring circuit is provided comprising three switches. A test sequence is employed for testing the insulation resistance monitor before monitoring insulation faults in the vehicle. Only if the test sequence is passed successfully, the measurement of the insulation resistance is performed.

Usually, the insulation resistance monitor is connected in parallel with the battery cells, behind the battery disconnect breakers. When driving e.g. a hybrid electric vehicle, rotating electric machines with permanent magnets will create hazardous voltages in the electric circuit connected to the electric machine and the inverter (power electronics). Thus, if the battery breakers are opened, it will not be possible to measure any insulation resistance outside of the battery breakers, i.e. outside of the battery enclosure.

In some circumstances, e.g. battery faults like battery over-temperature, abnormal cell voltage distribution, etc., in known systems the battery will be disconnected from the "high-voltage" electric system. When the battery is disconnected, the insulation resistance monitor connected to the battery is not be able to monitor the insulation resistance in the energized circuit outside of the battery enclosure.

It is desirable to provide a method to provide insulation resistance monitoring even if an electrical power source is disconnected. It is also desirable to provide a vehicle employing a method for insulation resistance monitoring.

A method is proposed for monitoring an insulation fault in an electric network with at least one electric power system supplying electric power to one or more electric loads, and at least one insulation resistance monitor, wherein the at least one electric power system comprises at least one electric power source, and wherein the at least one insulation resistance monitor monitors an insulation resistance between terminal leads of the at least one electric power source and at least one reference potential. The method comprises the steps of (i) disconnecting the at least one electric power source from the one or more loads by opening each terminal lead; (ii) measuring the insulation resistance between the electric circuit of at least one electrical power source and the reference potential; (iii) measuring the insulation resistance for the total electric network, preferably between the at least one electrical power source and the reference potential, (iv) closing one terminal lead with the other terminal lead open and (v) measuring the insulation resistance (R_isol2) for the total electric network.

Favourably, the electrical current provided by the at least one electric power source is disabled as long as one terminal lead is open. Particularly, opening a terminal lead can be achieved by opening one or more breakers arranged in the terminal lead. The invention can be employed with electric power sources such as energy storage units, such as batteries, ultra-capacitors, as well as fuel cell units. By opening both terminal leads, the insulation resistance of the electric power source itself can be tested. If no fault is detected, no insulation fault is injected into the energized electric system from the electric power source. Further, the risk that the measured isolation resistance is deteriorated by a very low internal resistance can be eliminated. If an insulation fault is detected, it can be decided if the electrical power source is to be shut down or the system is to be used without an insulation resistance monitor. Advantageously, the insulation resistance of the electric power source itself, when both terminal leads are opened, can be used to compensate for this insulation resistance in the measurement with a single terminal lead opened, thus increasing the accuracy of the measurement.

Further, various kinds of state-of-the art insulation resistance monitors can favourably employ the current invention. The invention provides a safe estimation of the insulation resistance. The invention provides a less costly solution compared to e.g. adding more insulation resistance monitors. Favourably, the insulation resistance can be measured on both poles of the electrical power source.

According to a favourable embodiment, the steps of (v) closing the second terminal lead with the first terminal lead open; and (vi) measuring the insulation resistance for the total electric network are not performed if the isolation resistance is below a predefined threshold. For instance, it is required that the insulation resistance must be at least 300 kω for a voltage of 600 V dc. Not performing the steps can advantageously reduce the risk for an electric shock due to indirect contact. Further, this can reduce the risk for measurement deterioration of the measured isolation values for the disconnected parts of the electric system, i.e. without the electric power source.

Advantageously it is possible to compensate the measured insulation resistance of the total electric network for the insulation resistance between the electric circuit of at least one electrical power source and the reference potential in order to obtain the isolation resistance for the electric network without the disconnected electric power source.

According to a favourable embodiment, the electrical power source can be shut down when an insulation fault is detected when both terminals are open. Additionally or alternatively, an indication that no insulation resistance monitor is available can be issued when an insulation fault is detected when both terminals are open.

According to another favourable embodiment, at least one terminal can be opened periodically to provide monitoring of the insulation resistance. One of the breakers can also be closed continuously to provide isolation monitoring of the part of the electric that is located on the other side of the electric power source breaker. As long as one of the electric power source breakers, e.g. battery breakers, is open, it possible to have the other breaker closed in order to monitor the "disconnected" part of electric system.

According to another favourable embodiment, at least one terminal can be opened by opening a breaker arranged in the respective terminal. Preferably, at least one of the breakers can be surveyed with respect to its open/close operation. Preferably, a voltage over at least one breaker can be determined by measuring the voltage on each side of the particular breaker. By measuring the voltage on each side of the breaker a reliable diagnosis means of the breaker is available. Particularly, a voltage drop over at least one breaker can be determined by measuring the voltage on each side of the particular breaker. This measurement can be performed during and before the isolation testing. If this measurement shows that the breakers do not function properly (i.e. the voltage difference is large when both breakers are closed or if the voltage difference is too small when the any breaker is open), the breakers cannot be controlled as intended, and the isolation measurement procedure is interrupted in order to maintain the electric power source current interruption. Favourably it is possible to detect an insulation fault and distinguish on which terminal the fault occurs. By using breakers, it is as well possible to decide on which side of the breaker the fault occurs.

According to another favourable embodiment, opening and closing operations of the terminals can be controlled by an electronic control unit of the electric power source. However, the opening and closing operations can alternatively or additionally be controlled by some supervising control unit. Favourably, an indicator signal can be issued indicating if the particular breaker has a requested state or not. If this measurement shows that the breakers do not function properly, the breakers cannot be controlled as intended, and the isolation measurement procedure is interrupted in order to maintain the electric power source current interruption. For instance, indicator signal contacts can be integrated into the breaker, which are connected if the breaker is closed and which are not connected if the breaker is opened. If the voltage is measured on both sides of the electric power source breakers, it can be used to diagnose if the breakers are functioning as intended. If the breakers do not operate according to the algorithm, the electric power supply current cannot be interrupted and the isolation measurement cannot be performed.

According to another favourable embodiment, an audible and/or visible and/or haptic alarm is issued on detecting an insulation fault. Safe information of the user is provided.

According to another aspect of the invention, a vehicle comprising at least an electric propulsion system powered by at least one electric power system is proposed, wherein at least one insulation resistance monitor for monitoring an insulation fault in an electric network is coupled to the electric propulsion system, wherein the at least one electric power system comprises at least one electric power source, and wherein the insulation resistance is monitored by performing the method according to one of the features described above.

In the vehicle, the power system is preferably a high voltage system, e.g. providing several hundreds of volts, for providing power to an electric motor which can be used e.g. for propelling the vehicle. Other usages include electric power generation by the electric motor for charging the electric power supply or for power supply to the electric auxiliary loads. The electric power system must be insulated against ground potential, e.g. the car body. The insulation resistance must be higher than a specified resistance. In today's vehicles with an electric motor the insulation resistance must be at least 300 kω for a voltage of 600 V dc.

Preferably, the at least one electric power source can comprise at least one electrical storage device, for instance a battery or a super capacitor.

According to another favourable embodiment, the at least one electric power source can comprise additionally or alternatively at least one fuel cell device.

According to another favourable embodiment, at least one breaker can be provided for performing the monitoring of the insulation resistance. A breaker, also known as battery breaker, is a standard device used in high voltage batteries or other electric power sources. In a preferred embodiment, one breaker can be provided per terminal of the electric power source.

According to another favourable embodiment, the at least one breaker can be arranged inside a housing of the at least one electric power source. It is possible to provide one or more breakers outside the housing additionally or alternatively to an arrangement inside the housing.

According to another favourable embodiment, the at least one breaker can be coupled to an electric motor drive system. The electric motor drive system favourably can comprise a motor inverter to which the breaker can be coupled.

According to another favourable embodiment, the vehicle can be embodied as an electric vehicle. The electric vehicle can provide a purely electric drive system which can be powered by one or more batteries and/or one or more super capacitors.

According to another favourable embodiment, the vehicle can be embodied as a hybrid vehicle. The hybrid vehicle can provide at least one electric drive system in combination with another source of propulsion energy, such as a combustion engine or a combination of fuel cell and electric energy storage. The hybrid vehicle can be a parallel or a series hybrid.

Further, a computer program is proposed comprising a computer program code adapted to perform a method or for use in a method according to at least one of the method steps described when said program is run on a programmable microcomputer. Favourably, the computer program can be adapted to be downloaded to a control unit or one of its components when run on a computer which is connected to the internet. The control unit can be a control unit controlling the electrical power source or the electric power system or some supervising control unit in a vehicle in which the electric power system is employed.

Further, a computer program product stored on a computer readable medium is proposed, comprising a program code for use in a method according to at least one of the method steps on a computer.

BRIEF DESCRIPTION OF THE DRAWINGS

The present invention may best be understood from the following detailed description of the embodiments, but not restricted to the embodiments, wherein is shown schematically.

DETAILED DESCRIPTION

Figure 1:
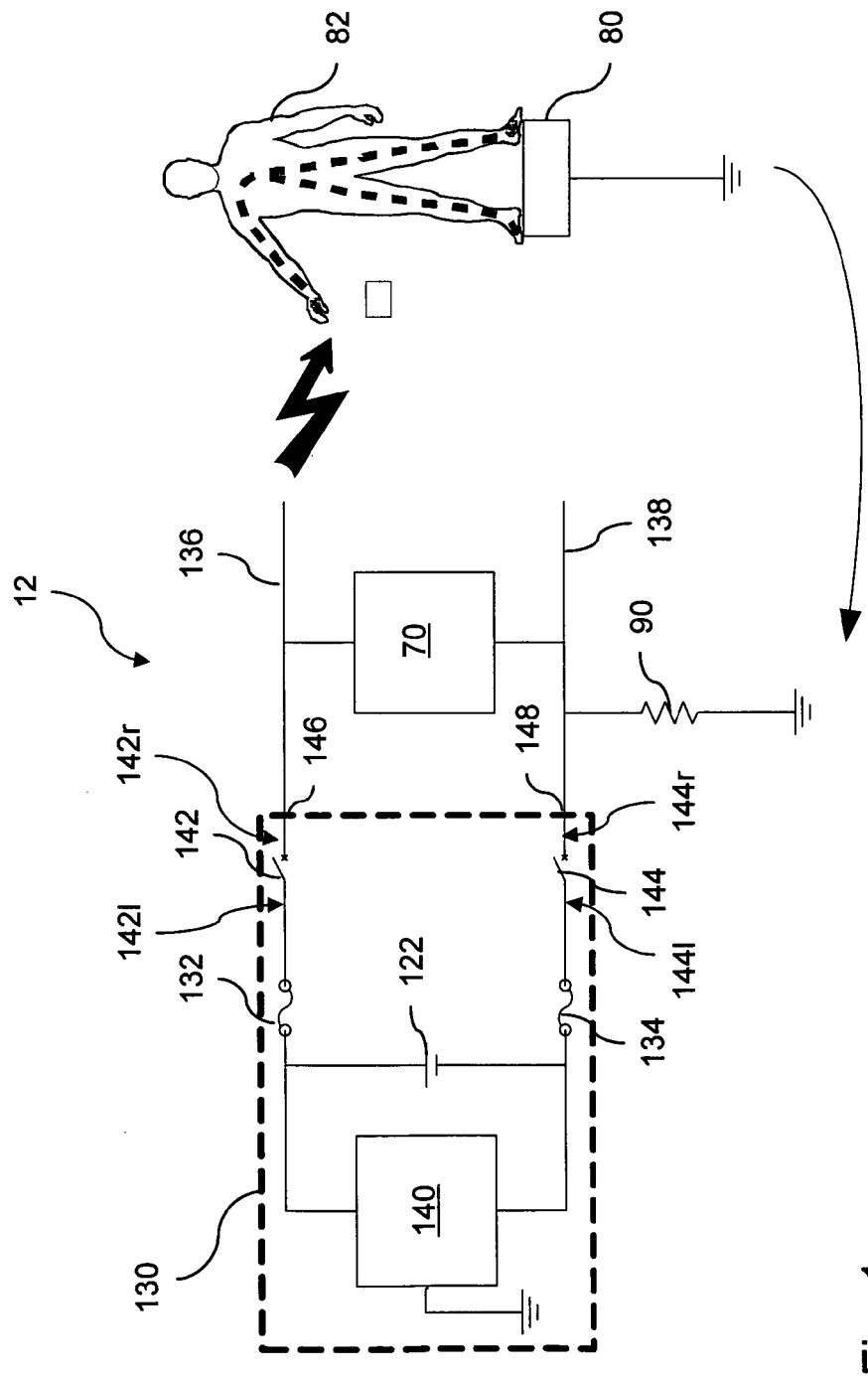
FIG. 1 a simplified diagram of the "high-voltage" electric system in a hybrid electric vehicle.

In the drawings, equal or similar elements are referred to by equal reference numerals. The drawings are merely schematic representations, not intended to portray specific parameters of the invention. Moreover, the drawings are intended to depict only typical embodiments of the invention and therefore should not be considered as limiting the scope of the invention.

FIG. 1 shows a simplified diagram of a "high-voltage" electric network 12 as used e.g. in a hybrid electric vehicle. In a vehicle, high voltage usually means a voltage level well above the 12 Volt dc voltage of a vehicle battery. In electric or hybrid vehicles, voltages of several hundred volts are provided for loads such as electric propulsion motors or the like.

An electric power source 122, e.g. a battery, is housed in a casing 130. The electric power source 122 provides two terminal leads 136 and 138 providing positive and negative poles 146 and 148 for the electrical supply of one or more loads 70 in the electric network 12. The terminals leads 136 and 138 and the one or more loads, 70 connected to the electric power source 122 are electrically insulated against a reference potential, for instance a ground potential. The ground potential corresponds e.g. to the chassis ground of the car body 80 of the vehicle. For a voltage of e.g. 600 V dc legal requirements demand an insulation resistance of at least 300 kω.

Inside the casing 130, in each of the terminal leads 136, 138 of the electric power source 122 a fuse 132, 134 may be arranged to protect the cables depending on cable current carrying capability, short-circuit current of the electric power source, breaker current-breaking capability and response, etc. Other components such as electronics and control units can also be arranged inside the casing 130.

In case of an over current, the fuse can open the respective terminal lead 136, 138 and disconnect the electric power source 122 from the electric network 12. Further, in each of the terminal leads inside the casing 130 a breaker 142 and 144 is arranged. The breakers 142, 144 are employed for opening and closing the terminal leads 136, 138.

An insulating fault monitor 140 is connected electrically in parallel to the electric power source 122, and with a connection to the reference potential. The insulation fault monitor 140 measures an insulation resistance between the electric power source 122 and the reference potential, e.g. ground potential at the electric chassis (conductive parts of a vehicle electrically connected, whose potential is taken as reference). An insulation fault can occur, e.g. due to a cable damage or the like. The insulation resistance monitor 140 can be any device which is known in the art for such a usage. The insulation fault monitor 140 usually provides three terminal a positive and a negative terminal to the battery and the electrical potential ground. The monitor can measure the separate isolation resistances of the both terminals, i.e. distinguish between the positive or negative side of the battery by means of the measurement method, e.g. by connecting a measurement resistance, or by injecting a measurement current.

When there is no insulation fault, a person 82 being in contact with the car body 80, e.g. in the cab of the vehicle, is not in danger of suffering from an electrical shock when touching at the same time one pole of the electric power source 122 or the electric load 70.

However, if there is an insulation fault, i.e. if there is an electrically conducting connection 90 below the required minimum insulation resistance between one of the poles and the ground potential, the person 82 will suffer from an electric shock when the insulation resistance 90 is sufficiently low between pole 146 or 148 and electric chassis ground and contacts the other pole 146 or 148 since the current can float in the closed circuit formed by chassis ground and person 82.

The breakers 142, 144 allow for disconnecting the electric power source 122 from the electric network 12 by opening the terminal leads 136, 138, wherein the breakers 142, 144 can be opened simultaneously as well as alternately in order to provide a measurement of the insulating resistance.

By opening both breakers 142, 144 it is possible to measure the insulation resistance of the electric power source 122 itself to the reference potential. When disconnecting the electric power source 122 from the electric network 12 by means of the two breakers 142, 144, it is not possible to monitor the insulation resistance in the electric network 12. By opening one of the breakers 142 or 144, it is possible to measure the insulation resistance selectively for each pole 146, 148 in the network 12.

By having a diagnosis for the breakers' 142, 144 open/close operation, the risk for not being able to interrupt electric current is reduced or even eliminated. The diagnosis can be implemented by, for example, measuring the voltage before and after the respective breaker 142, 144, or by having indicating signal breakers included in one or more breakers 142, 144. The voltage for the breaker 142 can be measured e.g. on locations 142r and 142l, and the voltage for the breaker 144 can be measured e.g. on locations 144r and 144l.

Figure 2:
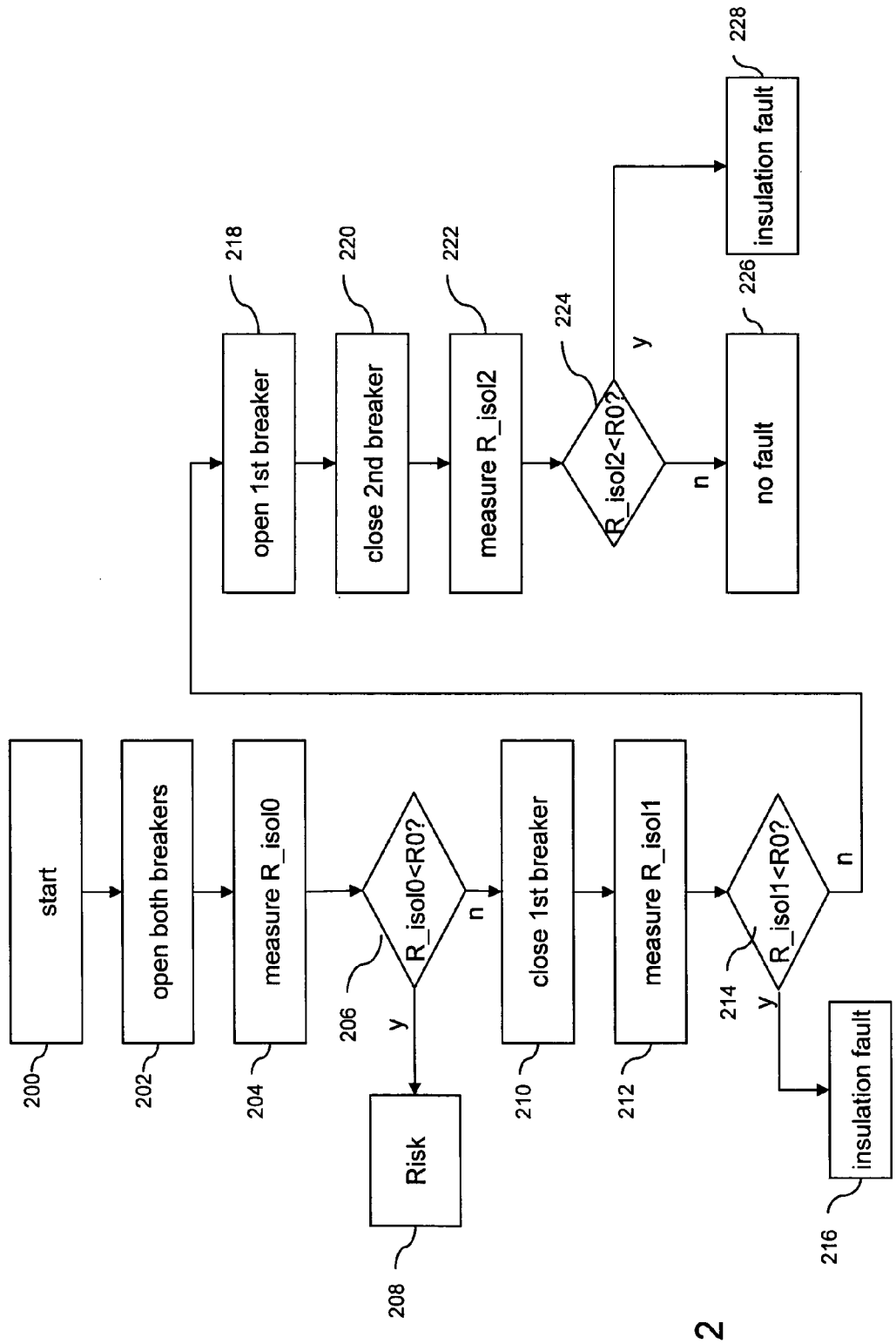
FIG. 2 a flow chart illustrating a preferred sequence of a method for monitoring an insulation fault according to the invention.

A preferred sequence for monitoring the insulation resistance is depicted in FIG. 2, which shows a flow chart illustrating the steps performed in the preferred sequence for monitoring an insulation fault according to the invention with reference to the arrangement shown in FIG. 1.

The preferred sequence according to the invention starts in step 200 when, by way of example, the vehicle is started. In step 202 each terminal lead 136, 138 of the electrical power source 122 is opened by opening both breakers 142, 144. Now, the electrical power source 122 is disconnected from the network 12 and the insulation resistance R_isol0 of the electric circuit of the electrical power source 122, e.g. a battery, a super capacitor, a fuel cell unit, against the reference potential can be determined in step 204 by the insulation resistance monitor 140.

In step 206, it is checked if the measured insulation resistance R_isol0 is less than a defined resistance R0. For instance, for a 600 V network 12, a resistance R0 of at least 300 kω is required. If R_isol0 is less than R0 ("y" in FIG. 2), then an insulation fault is detected for the electric power source 122 and the electric power supply may need to remain disconnected to avoid the risk of connecting its low isolation resistance to the rest of the vehicle thus increasing the risk for electric shock in the part of the electric system that is not connected to the battery or of deterioration of isolation measurement (step 208). The user can get a notification on the result of the measurement. Despite this insulation fault, the vehicle can be operated since there is only an increased risk for electric shock due to loss of insulation for one of the "high voltage" terminals. If the time used for isolation resistance measurement is short and/or if the measurement period is long and if the electric power source isolation resistance is large enough to avoid deterioration of the measured isolation resistance for the part of the electric system that is not outside of the breakers 142, 144, this problem may be disregarded.

If R_isol0 is at least as large as R0 ("n" in FIG. 2), then there is no insulation fault present in the electrical circuit of the electrical power source 122 and the insulation resistance monitor 140 is available.

In subsequent step 210 one terminal lead 136 or 138 is closed by closing the respective breaker 142 or 144, while the counterpart breaker 144 or 142 remains open. By closing one of the terminal leads 136 or 138, the insulation resistance R_isol1 can be measured for the electrically connected terminal lead 142 or 144 in step 212. The measured isolation resistance value may be compensated for the isolation resistance of the electric power source 122 that is not normally connected. The electric current from the electric power source 122 is disabled as long as at least one terminal lead 136, 138 is open.

In step 214, it is checked if the measured insulation resistance R_isol1 is less than the defined resistance RO. If R_isol1 is less than RO ("y" in FIG. 2), then an insulation fault is present for the closed terminal lead 136 or 138 under test (step 216). The user can get an appropriate notification on the result of the measurement. The sequence can be aborted or, alternatively, continued with step 218.

If R_isol1 is at least as large as RO ("n" in FIG. 2), then there is no insulation fault present for the respective closed terminal lead 136 or 138 under test.

In subsequent step 218 the closed terminal lead 136 or 138 is opened, e.g. by opening the respective breaker 142 or 144, and the other terminal lead 138 or 136 is closed, e.g. by closing the respective breaker 144 or 142 in step 220.

In step 222, the insulation resistance R_isol2 is measured for the actual configuration of the electrically connected terminal, lead 138 or 136.

In step 224, it is checked if the measured insulation resistance R_isol2 is less than the defined resistance RO. If R_isol2 is less than RO ("y" in FIG. 2), then an insulation fault is present for the closed terminal lead 138 or 136 under test (step 228). The user can get an appropriate notification on the result of the measurement. The sequence can be aborted.

If R_isol2 is at least as large as RO ("n" in FIG. 2), then there is no insulation fault present for the respective closed terminal lead 138 or 136 under test (step 226).

When the insulation resistances R_isol1 and/or R_isol2 are measured, the accuracy is increased if measured values are compensated for the insulation resistance R_isol0.

It is possible to detect on which pole 146, 148 and terminal lead 136, 138 an insulation fault is present. It is also possible to detect on which side of the breaker 142, 144 an insulation fault is present, by using, for instance, the method in the standard ISO 6469.

One of the breakers 142, 144 can be connected continuously or they can be reconnected periodically to provide measurement of insulation resistance as long as the breaker is open.

Figure 3A:
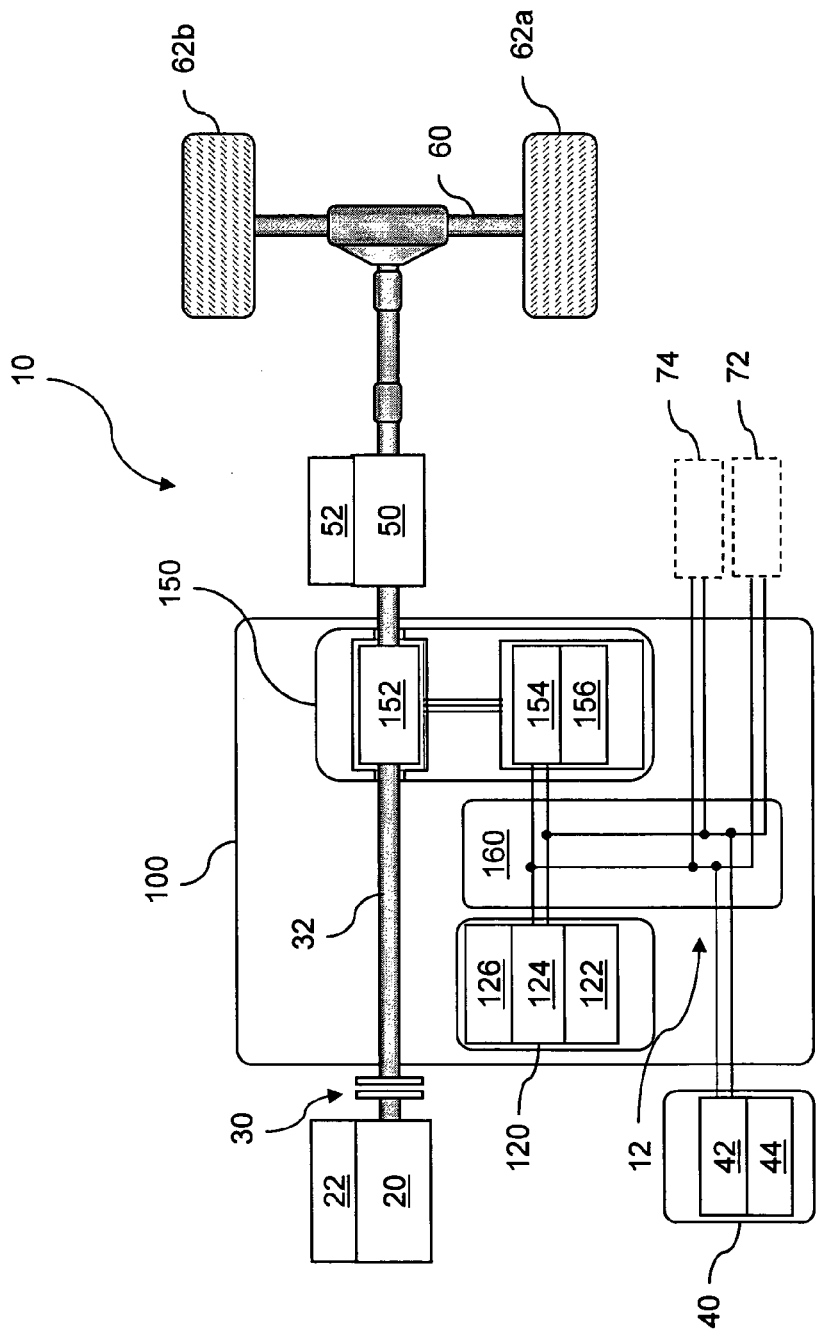
FIG. 3a, 3b a preferred vehicle according to the invention (FIG. 3a) and a detail of the electric power system comprising an insulation resistance monitor (FIG. 3b).

FIG. 3a illustrates a preferred hybrid vehicle 10 (schematically shown) according to the invention.

The vehicle 10 is by way of example embodied as a hybrid vehicle comprising a combustion engine 20, controlled e.g. by an engine electronic control unit 22, and an electric propulsion system 100. The combustion engine 20 drives a drive shaft 32 on which a gearbox 50, controlled e.g. by a transmission electronic control unit 52, is arranged. The gear box 50 can be e.g. an automatic mechanical transmission (AMT). The drive shaft 32 transmits torque to wheel axle 60 carrying wheels 62a, 62b. The combustion engine 20 can be connected and disconnected from the drive shaft. 32 by a clutch 30.

The electric propulsion system 100 comprises a motor drive system 150, an electric power supply system 120 and a junction box 160 for connecting the electric power supply system 120 and the motor drive system 150. The junction box 160 also provides connections for electric auxiliary components 72, 74 (and load 70, FIG. 1), such as compressors, pumps and the like, to the high electric voltage provided by the electric power supply system 120. A dc/dc converter 40 is coupled the junction box 160. The dc/dc converter 40 provides a power electronics 42 and a dc/dc electronic control unit 44

Figure 3B:
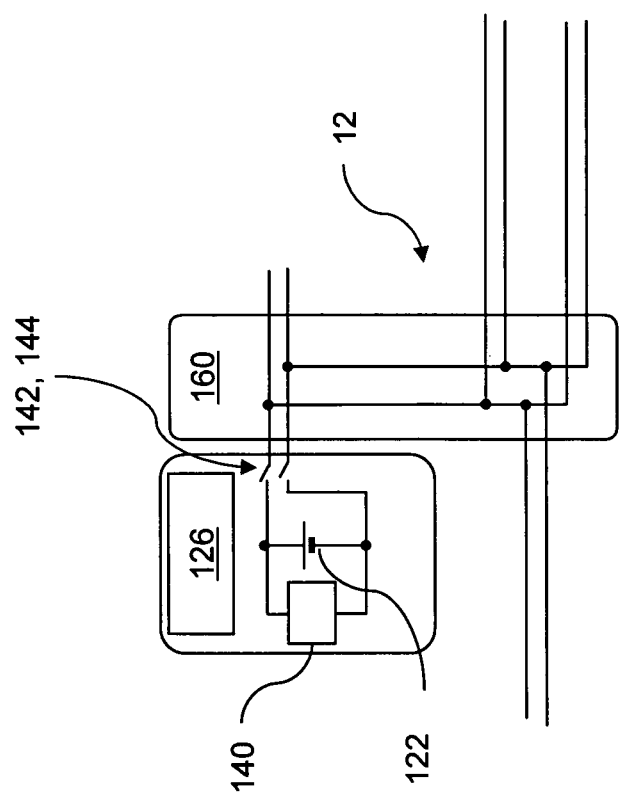

The electric power supply system 120 comprises an electric power source 122, such as a battery, a super capacitor or a fuel cell unit or the like, electronics 124 for safety and survey of the electric power source 122, e.g. control of temperature and state of charge and the like, and a source electronic control unit 126. A detail of a preferred embodiment of the electric power supply system 120 is depicted in FIG. 3b, wherein the electric power supply system 120 comprises an insulation resistance monitor 140 connected electrically in parallel to the electric power source 122. One breaker 142, 144 is arranged in each terminal lead of an electric power source 122.

The electric motor drive system 150 comprises an electric motor 152 coupled to the drive shaft 32. The electric motor 152 can be fixedly mounted on the drive shaft 32. A power electronic frequency converter (AC/DC) 154 is connected to the electric motor 152 as well as a motor electronic control unit 156. If the motor 152 is permanently magnetized (e.g. with permanent magnets), the motor 152 will produce a voltage that can be hazardous when it is rotated, e.g. when the clutch 30 is closed and the drive shaft 32 rotating.

An insulation fault monitor is preferably integrated electric power supply system 120, particularly in the electric power supply 122, as described in FIG. 1. The insulation fault monitor can also be installed in other locations. Preferably, on or more breakers are provided for performing the preferred sequence described in FIG. 2 for measuring an insulation resistance. Preferably, breakers can be arranged in the electric power supply casing as described in FIG. 1. It is also possible to provide breakers in the motor drive system 159, particularly in the motor inverter.

The invention claimed is:

1. A method for monitoring an insulation fault in an electric network with at least one electric power system supplying electric power to one or more electric loads, and at least one insulation resistance monitor, wherein the at least one electric power system comprises at least one electrical power source, and wherein the at least one insulation resistance monitor monitors an insulation resistance between terminal leads of the at least one electric power source and at least one reference potential, each terminal lead having a respective breaker for opening and closing the terminal lead, the electric power source and the insulation resistance monitor being disposed on a same side of the breakers for the terminal leads, comprising the steps of
    (i) disconnecting the at least one electric power source from the one or more loads by opening each terminal lead by opening the respective breakers for the terminal leads;
    (ii) measuring the insulation resistance (R_isol0) between the electric circuit of at least one electrical power source and the reference potential;
    (iii) measuring the insulation resistance (R_isol1) for the total electric network;
    (iv) closing one terminal lead by closing the respective breaker for the one terminal lead with the other terminal lead open; and
    (v) measuring a second insulation resistance (R_isol2) for the total electric network.

2. The method according to claim 1, comprising not performing the steps of
    (iv) closing one terminal lead with the other terminal lead open; and
    (v) measuring the insulation resistance (R_isol2) for the total electric network if an isolation resistance is below a predefined threshold.

3. The method according to claim 1, comprising compensating the measured insulation resistance (R_isol1, R_isol 2) of the total electric network for the insulation resistance (R_isol0) between the electric circuit of at least one electrical power source and the reference potential.

4. The method according to claim 1, comprising shutting down the electrical power source when an insulation fault is detected when both terminals are open.

5. The method according to claim 1, comprising issuing an indication that no insulation resistance monitor is available when an insulation fault is detected when both terminal leads are open.

6. The method according to claim 1, wherein at least one terminal lead is closed periodically to provide monitoring of the insulation resistance with the other terminal lead opened.

7. The method according to claim 1, wherein at least one terminal is opened and closed by opening and closing a breaker arranged in the respective terminal.

8. The method according to claim 7, wherein at east one of the breakers is surveyed with respect to open/close operation.

9. The method according to claim 7, wherein a voltage drop over at least one breaker is determined by measuring the voltage on each side (142r, 142l; 144r, 144l) of the particular breaker.

10. The method according to claim 9, wherein an indicator signal is issued indicating if the particular breaker has a requested state or not.

11. The method according to claim 1, wherein opening and closing operations of the terminal leads are controlled by an electronic control unit of the electrical power source.

12. The method according to claim 1, wherein an audible and/or visible and/or haptic alarm is issued on detecting an insulation fault.

13. Computer comprising a computer program code adapted to perform a method or for use in method according to claim 1.

14. Computer according to claim 13 adapted to download the computer program code to a control unit or one of its components when connected to the internet.

15. Computer program product stored on a non-transitory computer readable medium, comprising a program code for use in a method according to claim 1.

16. A method for monitoring art insulation fault in an electric network with at least one electric power system supplying electric power to one or more electric loads, and at least one insulation resistance monitor, wherein the at least one electric power system comprises at least one electrical power source, and wherein the at least one insulation resistance monitor monitors an insulation resistance between first and second terminal leads of the at least one electric power source and at least one reference potential, each terminal lead having a respective breaker for opening and closing the terminal lead, the electric power source and the insulation resistance monitor being disposed on a same side of the breakers for the first and second terminal leads, wherein the following steps are performed
 (i) disconnecting the at least one electric power source from the one or more loads by opening each terminal lead by opening the respective breakers for the terminal leads;
 (ii) measuring the insulation resistance between the electric circuit of at least one electrical power source and the reference potential;
 (iii) measuring the insulation resistance for the total electric network;
 (iv) closing the second terminal lead by closing the respective breaker for the second terminal lead with the first terminal lead open; and
 (v) measuring a second insulation resistance for the total electric network.

17. The method according to claim 16, wherein the steps of (iv) closing one terminal lead with the other terminal lead open; and (v) measuring the insulation resistance for the total electric network are not performed if an isolation resistance is below a predefined threshold.

18. The method according to claim 16, wherein the measured insulation resistance of the total electric network is compensated for the insulation resistance between the electric circuit of at least one electrical power source and the reference potential.

19. The method according to claim 16, wherein the electrical power source is shut down when an insulation fault is detected when both terminals are open.

20. The method according to claim 16, wherein an indication that no insulation resistance monitor is available is issued when an insulation fault is detected when both terminal leads are open.

21. The method according to claim 16, wherein at least one terminal lead is closed periodically to provide monitoring of the insulation resistance with the other terminal lead opened.

22. The method according to claim 16, wherein at least one terminal lead is opened and closed by opening and closing a breaker arranged in the respective terminal.

23. The method according to claim 22, wherein at least one of the breakers is surveyed with respect to open/close operation.

24. The method according to claim 22, wherein a voltage drop over at least one breaker is determined by measuring the voltage on each side of the particular breaker.

25. The method according to claim 24, wherein an indicator signal is issued indicating if the particular breaker has a requested state or not.

26. The method according to claim 16, wherein opening and closing operations of the terminal leads are controlled by an electronic control unit of the electrical power source.

27. The method according to claim 16, wherein an audible and/or visible and/or haptic alarm is issued on detecting an insulation fault.

28. Computer comprising a computer program code adapted to perform a method or for use in a method for monitoring an insulation fault in an electric network with at least one electric power system supplying electric power to one or more electric loads, and at least one insulation resistance monitor, wherein the at least one electric power system comprises at least one electrical power source, and wherein the at least one insulation resistance monitor monitors an insulation resistance between first and second terminal leads of the at least one electric power source and at least one reference potential, each terminal lead having a respective breaker for opening and closing the terminal lead, the electric power source and the insulation resistance monitor being disposed on a same side of the breakers for the first and second terminal leads, wherein the steps following are performed
 (i) disconnecting the at least one electric power source from the one or more loads by opening each terminal lead by opening the respective breakers for the terminal leads;
 (ii) measuring the insulation resistance between the electric circuit of at least one electrical power source and the reference potential;
 (iii) measuring the insulation resistance for the total electric network;
 (iv) closing the second terminal lead by closing the respective breaker for the second terminal lead with the first terminal lead open; and (v) measuring a second insulation resistance for the total electric network, when the program is run on a programmable microcomputer.

29. Computer according to claim 28 adapted to to download the computer program code to a control unit or one of its components when the computer is connected to the internet.

30. Computer program product stored on a non-transitory computer readable medium, comprising a program code for use on a computer in a method for monitoring an insulation fault in an electric network with at least one electric power system supplying electric power to one or more electric loads, and at least one insulation resistance monitor, wherein the at least one electric power system comprises at least one electrical power source, and wherein the at least one insulation resistance monitor monitors an insulation resistance between first and second terminal leads of the at least one electric power source and at least one reference potential, each terminal lead having a respective breaker for opening and closing the terminal lead, the electric power source and the insulation resistance monitor being disposed on a same side of the breakers for the first and second terminal leads, wherein the following steps are performed (i) disconnecting the at least one electric power source from the one or more loads by opening each terminal lead by opening the respective breakers for the terminal leads;

(ii) measuring the insulation resistance between the electric circuit of at least one electrical power source and the reference potential;

(iii) measuring the insulation resistance for the total electric network;

(iv) closing the second terminal lead by closing the respective breaker for the second terminal lead with the first terminal lead open; and (v) measuring a second insulation resistance for the total electric network.

* * * * *